United States Patent
Abe et al.

(10) Patent No.: US 10,804,128 B2
(45) Date of Patent: Oct. 13, 2020

(54) ARTICLE STORAGE FACILITY

(71) Applicant: Daifuku Co., Ltd., Osaka-shi (JP)

(72) Inventors: Takeshi Abe, Hinocho (JP); Tadahiro Yoshimoto, Hinocho (JP); Kazuya Omori, Hinocho (JP); Shinsuke Kawamura, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 430 days.

(21) Appl. No.: 15/697,705

(22) Filed: Sep. 7, 2017

(65) Prior Publication Data

US 2018/0076077 A1 Mar. 15, 2018

(30) Foreign Application Priority Data

Sep. 9, 2016 (JP) .................................. 2016-176980

(51) Int. Cl.
*H01L 21/677* (2006.01)
*H01L 21/67* (2006.01)
(Continued)

(52) U.S. Cl.
CPC .. *H01L 21/67769* (2013.01); *H01L 21/67017* (2013.01); *H01L 21/67393* (2013.01);
(Continued)

(58) Field of Classification Search
CPC ......... H01L 21/67389; H01L 21/67769; H01L 21/67775; H01L 21/67393; H01L 21/67017; B65G 2201/0297; B65G 2201/0407; F24F 3/161; A47F 3/04; A47F 3/0439; A47F 3/0443; A47F 3/0452
(Continued)

(56) References Cited

U.S. PATENT DOCUMENTS 2,984,085 A * 5/1961 Rainwater ............. A47F 3/0452
62/256
6,128,911 A * 10/2000 Mathews ............. A47F 3/0408
62/256
2003/0050005 A1 3/2003 Nakao

FOREIGN PATENT DOCUMENTS

JP 6345206 A 12/1994
JP 2002343846 * 5/2001
(Continued)

*Primary Examiner* — Steven B McAllister
*Assistant Examiner* — Charles R Brawner
(74) *Attorney, Agent, or Firm* — The Webb Law Firm

(57) ABSTRACT

A transport space Si is formed in front of an article storage rack 1, and a plurality of up-down partition bodies that partition storage sections 1a adjacent to each other in an up-down direction are provided in the article storage rack 1. A flow path space S2 extending in the up-down direction is formed between a wall portion 43 and the plurality of storage sections 1a, and each of the plurality of storage sections 1a is located between the flow path space S2 and the transport space S1, and is in communication with the flow path space S2 and the transport space S1. A gas supply portion 51 includes a flow inlet 53 into which a gas from the outside flows, and is in communication with an upper end portion of the transport space S1 and an upper end portion of the flow path space S2. The gas supply portion 51 includes a guide portion that guides the gas that has flowed in from the flow inlet 53 to the flow path space S2 and the transport space Si such that the air pressure inside the transport space S1 is smaller than the air pressure inside the flow path space S2.

10 Claims, 7 Drawing Sheets

(51) Int. Cl.
  *H01L 21/673*   (2006.01)
  *B65G 1/04*     (2006.01)
  *F24F 3/16*     (2006.01)
(52) U.S. Cl.
  CPC ...... *H01L 21/67775* (2013.01); *B65G 1/0407* (2013.01); *B65G 2201/0297* (2013.01); *F24F 3/161* (2013.01); *H01L 21/67028* (2013.01)
(58) Field of Classification Search
  USPC .......................................................... 454/187
  See application file for complete search history.

(56)         References Cited

FOREIGN PATENT DOCUMENTS

| JP | 2002343846 A |   | 11/2002 |
|----|--------------|---|---------|
| JP | 200381406 A  |   | 3/2003  |
| JP | 2009184787   | * | 2/2008  |
| JP | 2008218687 A |   | 9/2008  |
| JP | 2009184787 A |   | 8/2009  |

* cited by examiner

ARTICLE STORAGE FACILITY

CROSS-REFERENCE TO RELATED APPLICATION

This application claims priority to Japanese Patent Application No. 2016-176980 filed Sep. 9, 2016, the disclosure of which is hereby incorporated in its entirety by reference.

FIELD OF THE INVENTION

The present invention relates to an article storage facility including; an article storage rack including a plurality of storage sections aligned in an up-down direction; a transport device that transports an article to the storage sections; and a wall portion that covers a rear of the article storage rack in a state in which gas ventilation is limited, wherein a transport space extending in the up-down direction is formed in front of the article storage rack, and the transport device is installed in the transport space.

BACKGROUND

A conventional example of such an article storage facility is described in JP 2003-081406A (Patent Document 1). In the article storage facility of Patent Document 1, a wall portion is installed so as to be spaced apart rearwardly from the plurality of storage sections, thus forming a flow path space extending in the up-down direction between the wall portion and the plurality of storage sections. Then, a blower device (air volume adjuster 14) is installed between the flow path space and the storage sections, and a gas is blown by the blower device from the flow path space toward the storage sections, thus allowing the gas in the flow path space to flow into the transport space through the storage sections. By allowing the gas to flow in this manner, dust or the like generated by the transport device is inhibited from flowing into the storage sections, thus preventing contamination of articles stored in the storage sections.

SUMMARY OF THE INVENTION

The article storage facility of Patent Document 1 requires a high running cost since the blower device is provided between the flow path space and the storage sections. To solve this problem, it is conceivable to suppress the running cost by omitting the blower device between the flow path space and the storage sections. However, this leads to the following problem.

That is, for the article storage section of Patent Document 1, a uniform gas flow rate in the plurality of storage sections is achieved by providing a blower device for each of the storage sections and forcefully blowing a gas from the flow path space toward the transport space. However, if the blower device is not provided, imbalances occur between the gas flow rate of the plurality of storage sections. Specifically, a gas easily flows from a downstream portion of the flow path space to a downstream portion of the storage spaces. Conversely, a gas is difficult to flow from an upstream portion of the flow path space to a downstream portion of the storage spaces. Accordingly, in a storage section located in an upper portion among the plurality of storage sections aligned in the up-down direction, a gas is likely to flow back from the transport space toward the flow path space, for example, when the transport device is activated. Since a gas is difficult to flow from the transport space to the upstream side of the flow path space, the amount of the gas flowing downwardly on the upstream side of the transport space is reduced, making it difficult to allow dust to flow downwardly on the upstream side of the transport space in an appropriate manner.

Therefore, there is a need for an article storage facility that inhibits a backflow of a gas from the transport space to the storage sections while suppressing the running cost, and can easily allow dust to flow downwardly on the upstream side of the transport space in an appropriate manner.

A characteristic feature of an article storage facility includes: an article storage rack including a plurality of storage sections aligned in an up-down direction; a transport device that transports an article to the storage sections; and a wall portion that covers a rear of the article storage rack in a state in which gas ventilation is limited, wherein a transport space extending in the up-down direction is formed in front of the article storage rack, and the transport device is installed in the transport space; the article storage rack includes a plurality of up-down partition bodies that partition the storage sections adjacent to each other in the up-down direction in a state in which gas ventilation is limited; the wall portion is installed so as to be spaced apart in a rearward direction from the plurality of storage sections and a flow path space extending in the up-down direction is formed between the wall portion and the plurality of storage sections; in a front-rear direction in which the article storage rack and the transport space are aligned as viewed in the up-down direction, each of the plurality of storage sections is located between the flow path space and the transport space and is in communication with the flow path space and the transport space; the article storage facility further includes a gas supply portion provided above the transport space, the flow path space, and the plurality of storage sections, and a gas exhaust portion provided below the flow path space and the plurality of storage sections; the gas supply portion includes a flow inlet in which a gas from outside flows, and is in communication with an upper end portion of the transport space and an upper end portion of the flow path space; the gas exhaust portion is in communication with a lower end portion of the transport space; and the gas supply portion includes a guide portion that guides a gas that has flowed in from the flow inlet to the upper end portion of the flow path space and the upper end portion of the transport space such that an air pressure inside the transport space is smaller than an air pressure inside the flow path space.

According to this characteristic feature, the gas that has flowed in from the flow inlet flows to the upper end portion of the flow path space and the upper end portion of the transport space such that the air pressure inside the transport space is smaller than the air pressure inside the flow path space. Accordingly, a gas can easily flow from the flow path space having a high air pressure toward the transport space having a low air pressure without providing a blower device for each of the storage sections and forcefully blowing a gas from the flow path space toward the transport space. Therefore, a gas can easily flow from the flow path space toward the transport space not only on the downstream side of the flow path space where a gas can relatively easily flow toward the transport space, but also on the upstream side of the flow path space where a gas is relatively difficult to flow toward the transport space. Accordingly, for example, when the transport device is operated, a gas is difficult to flow back from the transport space toward the flow path space in the storage section of the plurality of storage sections aligned in the up-down direction that is located upward. Since the gas from the flow path space can easily flow in on the upstream side of the transport space, the amount of the gas flowing downwardly on the upstream side of the transport space is increased, so that dust can be easily moved downwardly on the upstream side of the transport space in an appropriate manner.

Thus, the omission of the blower device in the storage sections makes it possible to inhibit a backflow of a gas from the transport space to the storage sections and easily cause dust to flow downwardly on the upstream side of the transport space in an appropriate manner, while suppressing the running cost.

DETAILED DESCRIPTION

Hereinafter, an embodiment of an article storage facility will be described with reference to the drawings.

Figure 1:
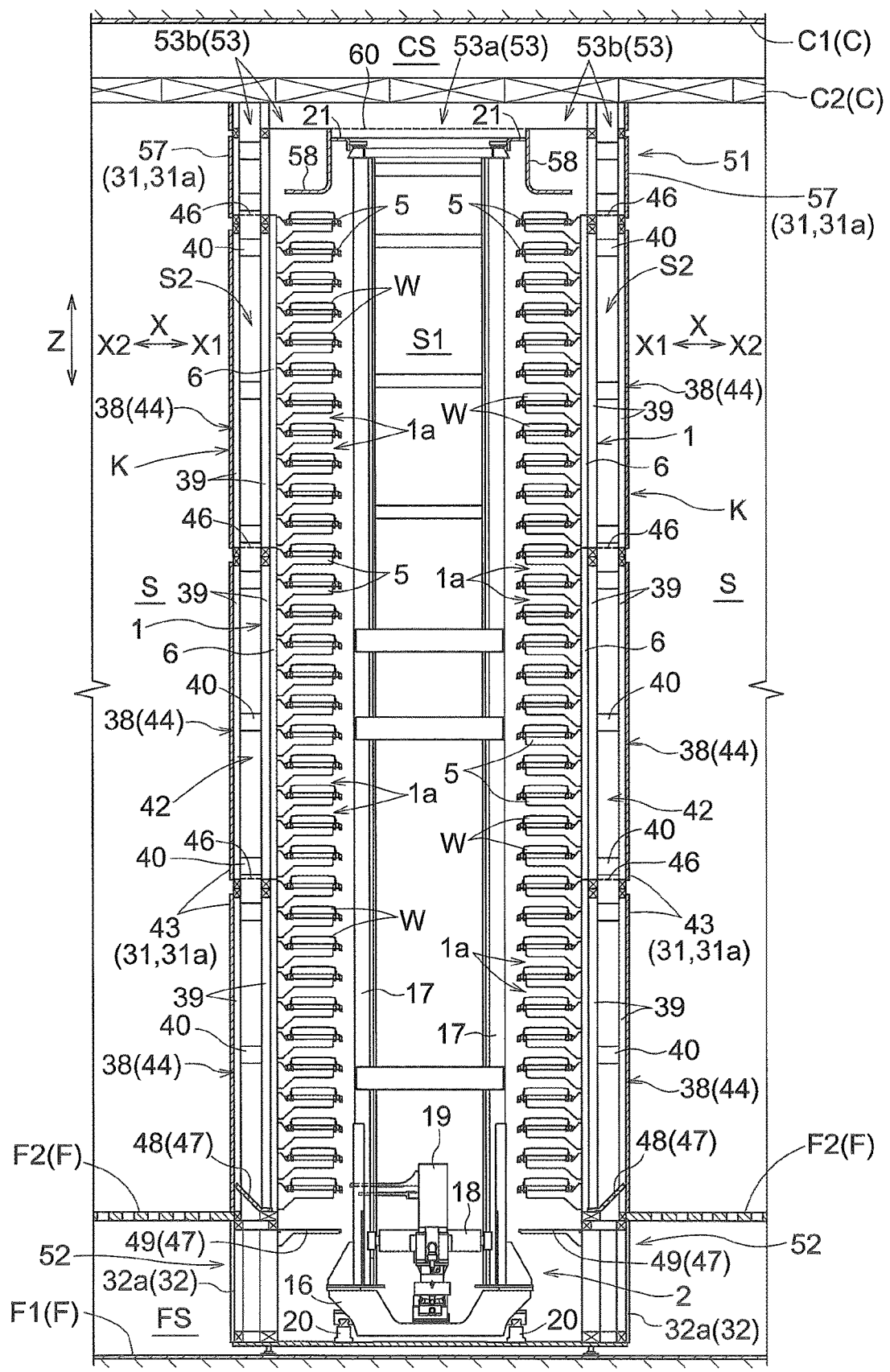
FIG. 1 is a side view of an article storage facility.
Figure 2:
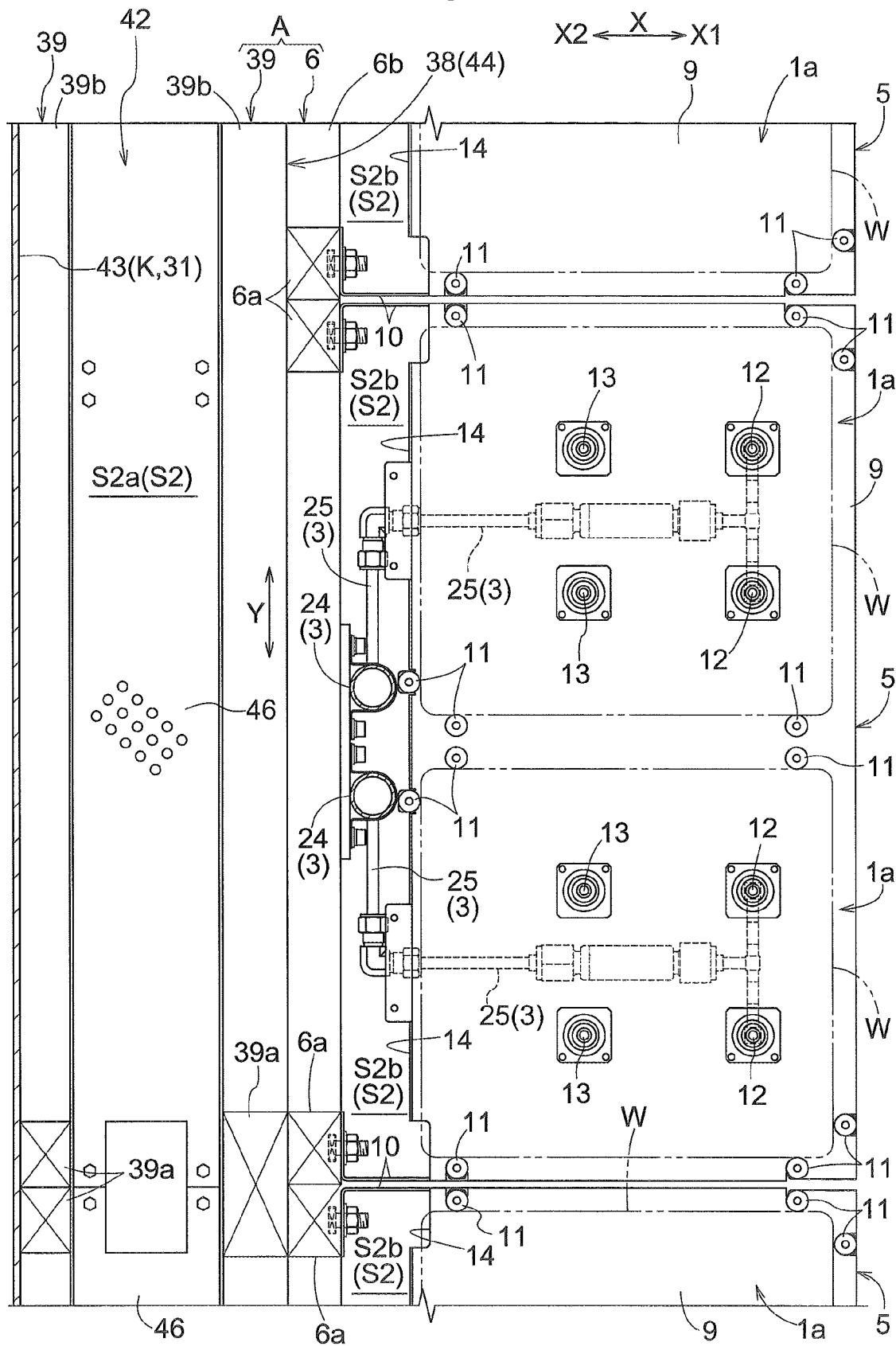
FIG. 2 is a partially enlarged plan view of storage sections and a flow path space.
Figure 3:
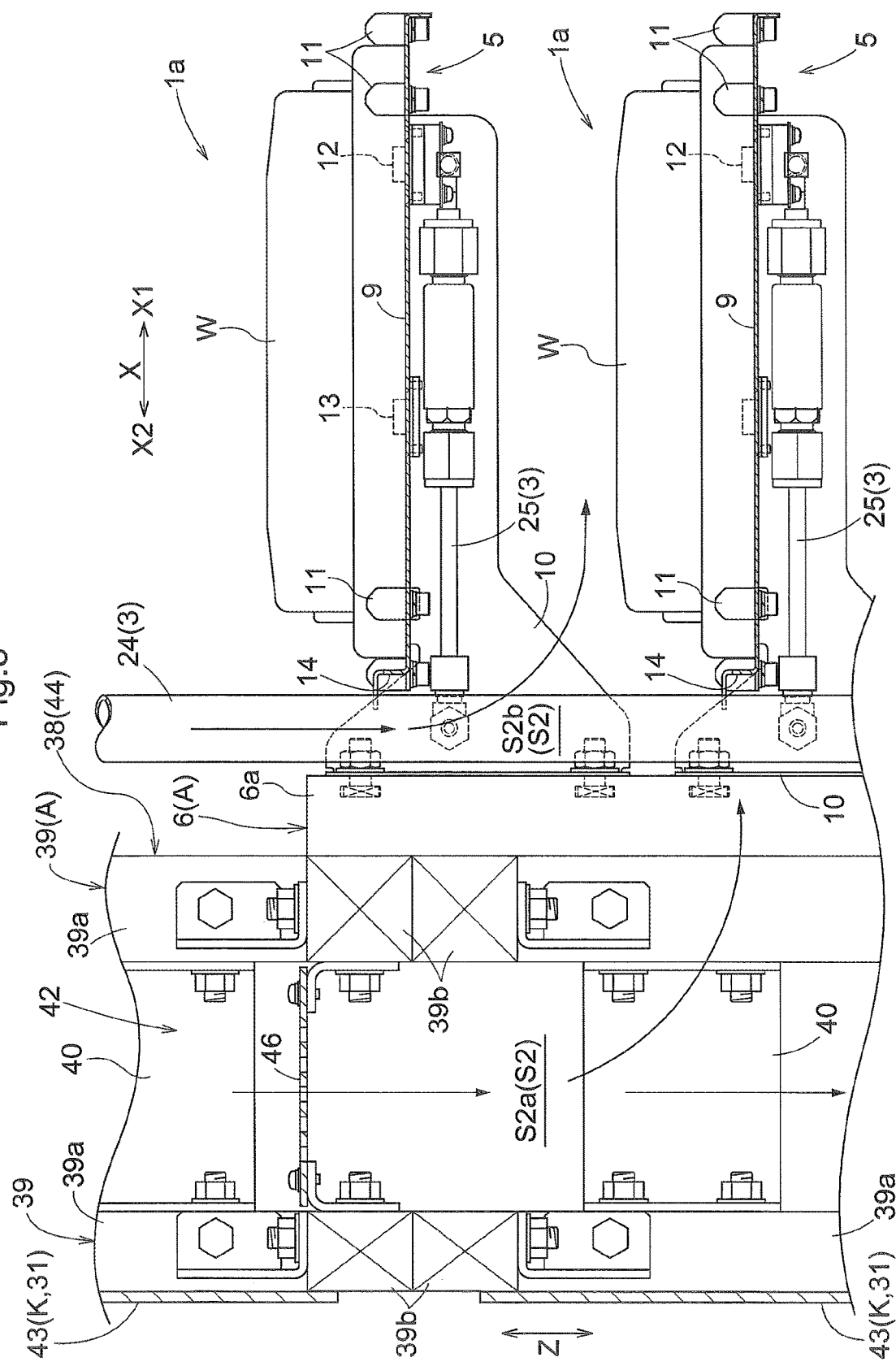
FIG. 3 is a partially enlarged side view of the storage sections and the flow path space.

As shown in FIG. 1, an article storage facility includes article storage racks 1 each including a plurality of of storage sections 1a that store containers W as articles, a stacker crane 2 as a transport device that transports the containers W to the storage sections 1a, and a gas supply device 3 (see FIGS. 2 and 3). The article storage facility also includes a wall member K that covers the side periphery of an installation space in which the article storage racks 1 and the stacker crane 2 are installed so as to limit the passage of air (gas).

As shown in FIGS. 2 and 3, each of the article storage racks 1 includes a plurality of storage sections 1a for storing the containers W. The gas supply device 3 is configured to supply a clean dry air (hereinafter abbreviated as "dry air") as a gas into the containers W stored in the storage sections 1a. That is, due to the provision of the gas supply device 3, the gas supplied into the container W has a lower humidity than the gas in the storage section 1a.

Each of the containers W is configured to be capable of housing one substrate. In the present embodiment, the substrate is a reticle, and the container W is a container W that houses the reticle.

As shown in FIG. 1, the article storage facility is installed inside a down flow-type clean room in which a gas flows downwardly from a ceiling portion C to a floor portion F.

The floor portion F of the clean room includes a lower floor portion F1, and an upper floor portion F2 installed above the lower floor portion F1. The lower floor portion F1 is a floor that has no ventilation hole and is non-permeable, and the upper floor portion F2 is a floor that has ventilation holes and is permeable in an up-down direction Z. In the present embodiment, the lower floor portion F1 is composed of non-porous concrete, and the stacker crane 2 travels on the lower floor portion F1. In the present embodiment, the upper floor portion F2 is composed of a grating having a plurality of ventilation holes extending therethrough the up-down direction Z, and the operator walks on the upper floor portion F2.

The ceiling portion C of the clean room includes an upper ceiling portion C1, and a lower ceiling portion C2 installed below the upper ceiling portion C1. The upper ceiling portion C1 is a ceiling that has no ventilation hole and is non-permeable, and the lower ceiling portion C2 is a ceiling that is permeable in the up-down direction Z. In the present embodiment, the upper ceiling portion C1 is composed of non-porous concrete, and the lower ceiling portion C2 is composed of a filter such as a HEPA filter. Note that the lower ceiling portion C2 corresponds to a ceiling including a flow outlet for flowing a gas downwardly.

A floor space FS is formed between the lower floor portion F1 and the upper floor portion F2, and a ceiling space CS is formed between the upper ceiling portion C1 and the lower ceiling portion C2. A room space S is formed between the upper floor portion F2 and the lower ceiling portion C2. Then, by emitting air into the ceiling space CS by operating a blower device (not shown), air (clean air) that has been cleaned by the filter of the lower ceiling portion C2 flows downwardly in the room space S from the ceiling portion C toward the floor portion F.

Container

The bottom portion of each container W includes gas supply connected portions (not shown) and gas exhaust connected portions (not shown). Each gas supply connected portion is a portion for supplying the dry air emitted from gas supply connecting portions 12 of the gas supply device 3 into the container W. Each gas exhaust connected portion is a portion for discharging the gas inside the container W to the outside of the container W.

The gas supply connected portions of the container W are biased in a closed state by a biasing member such as a spring. When dry air is ejected from the gas supply connecting portions 12 of the gas supply device 3 in a state in which the gas supply connecting portions 12 are connected to the gas supply connected portions of the container W, the gas supply connected portions are operated to open by the pressure of the ejected dry air, and the dry air is supplied into the container W. Also, the gas exhaust connected portions of the container W are biased in a closed state by to biasing member such as a spring. When the pressure inside the container W is increased by the supply of dry air by the gas supply device 3, the gas exhaust connected portions are operated to open by that pressure, and the gas inside the container W is discharged from the gas exhaust connected portions.

The following is a description of the components of the article storage facility, assuming that the direction in which the article storage racks 1 and the transport space S1 are aligned is a front-rear direction X, the direction in which the transport space S1 is present relative to the article storage racks 1 is a forward direction X1, and the direction opposite thereto is a rearward direction X2. Also, the description is given, assuming that the direction orthogonal to the front-rear direction X as viewed in the up-down direction Z is a width direction Y. Note that as for the description of each container W, the front-rear direction X and the width direction Y are defined on the basis of the state in which the container W is stored in the storage section 1a.

Article Storage Rack

As shown in FIG. 1, a pair of the article storage racks 1 are installed in a state in which they oppose each other. The article storage racks 1 each include a plurality of storage sections 1a that are aligned in the up-down direction Z and the width direction Y. The pair of article storage racks 1 are configured in the same manner except that the directions in which they are installed are different.

As shown in FIGS. 2 and 3, each article storage rack 1 includes a plurality of support members 5 that support from below the containers W stored in the storage section 1a, and a rack frame body 6 that supports the plurality of support members 5.

The rack frame body 6 is assembled into a grid-like frame in which longitudinal frames 6a in an orientation extending along the up-down direction Z and lateral frames 6b in an orientation extending along the width direction Y are combined. To give an additional description, a plurality of lateral frames 6b are installed between two longitudinal frames 6a aligned in the width direction Y so as to form ladder-shaped frames, and the ladder-shaped frames are coupled in the width direction Y, thus forming a grid-like rack frame body 6.

The article storage rack 1 includes a plurality of support members 5 so as to be aligned in the up-down direction Z and the width direction Y. One support member 5 is provided for two storage sections 1a adjacent to each other in the width direction Y, and the size of the support member 5 in the width direction Y is formed so as to be able to support two containers W aligned in the width direction Y. Each support member 5 is formed in a plate shape whose main part (support portion 9) extends in the front-rear direction X and the width direction Y, and the support member 5 is supported by the rack frame body 6 in a cantilevered manner in a state in which an end portion at the rear X2 of the support member 5 is coupled to the rack frame body 6.

Each support member 5 includes a support portion 9 that supports from below the container W stored in the storage section 1a, and a pair of coupling portions 10 that are coupled to the rack frame body 6. The support portion 9 is a main part of the support member 5, and is formed in a flat plate shape extending in the front-rear direction X and the width direction Y.

The upper surface of the support portion 9 is provided with projection portions 11 protruding upwardly, gas supply connecting portions 12 for supplying, into the container W, dry air that is to be supplied by the gas supply device 3, and gas exhaust connecting portions 13 for allowing passage of the gas discharged from inside of the container W.

The support portion 9 is formed in a plate shape extending in the front-rear direction X and the width direction Y as described above, thereby partitioning the storage sections 1a adjacent to each other in the up-down direction Z in a state in which gas ventilation is limited. Here, the support portion 9 corresponds to the up-down partition body.

The projection portions 11 are provided so as to be located at a side periphery of the container W stored in the storage section 1a. By the projection portions 11 coming into abutment against the side surfaces of the container W, the container W is positioned in the storage section 1a formed on the support portion 9. Note that in the present embodiment, a plurality of (six for each container W) pin-shaped members are provided as the projection portion 11.

A branch pipe 25, which will be described later, that forms the gas supply device 3 is connected to the gas supply connecting portions 12. An exhaust pipe (not shown) is connected to the gas exhaust connecting portions 13. The exhaust pipe is open at an end portion opposite to the end portion that is connected to the gas exhaust connecting portions 13, and is configured to discharge the gas inside the exhaust pipe from the opposite end portion. In a state in which the container W is supported by the support member 5, the gas supply connecting portions 12 are connected to the gas supply connected portions of the container W, and the gas exhaust connecting portions 13 are connected to the gas exhaust connected portions of the container W.

The pair of coupling portions 10 are each formed in a flat plate shape extending along the up-down direction Z and the front-rear direction X. The pair of coupling portions 10 are provided at opposite end portions of the support portion 9 in the width direction Y, and each of the pair of coupling portions 10 is disposed so as to protrude rearwardly X2 relative to the rear end of the support portion 9. Then, the pair of coupling portions 10 are coupled to the pair of longitudinal frames 6a of the rack frame body 6.

A gap is formed between the rear end of the support portion 9 and the front end of the rack frame body 6, and this gap forms a through portion 14. That is, as described above, the support member 5 includes a through portion 14 that extends through in the up-down direction Z between the support portion 9 and the rack frame body 6 rearwardly X2 relative to the support portion 9 as a result of the pair of coupling portions 10 being coupled to the rack frame body 6 while protruding in the front-rear direction X.

Thus, the support member 5 includes the support portion 9 that supports from below the container W stored in the storage section 1a, and has the through portion 14 extending therethrough in the up-down direction Z, rearwardly X2 relative to the support portion 9.

The storage section 1a is formed above the support portion 9 of the support member 5. To give an additional description, the storage section 1a is formed in a region between the support portion 9 and another support portion 9 upwardly adjacent to the support portion 9. Then, as for the front-rear direction X and the width direction Y, the storage section 1a is formed in a region extending from the rear end to the front end of the support portion 9. Note that the uppermost storage section 1a is also formed in a region having the same size as the region in which the other storage sections 1a are formed. As in the present embodiment, if there is a portion where the rear end of the container W springs out rearwardly X2 from the support portion 9, the portion up to the rear end of the container W supported by the support portion 9 is the storage section 1a.

Then, each of the plurality of storage sections 1a is located between the transport space S1 and a flow path space S2, which will be described later, in the front-rear direction X, and is in communication with the transport space S1 and the flow path space S2.

As shown in FIG. 1, a transport space S1 extending in the up-down direction Z is formed in front X1 of the article storage rack 1, and the stacker crane 2 is installed in the transport space S1. Note that the transport space S1 is a space located forward X1 relative to the support member 5. When the pair of article storage racks 1 are installed so as to oppose each other as in the present embodiment, the transport space S1 is formed between the support member 5 of one of the article storage racks 1 and the support member 5 of the other article storage rack 1.

Stacker Crane

The stacker crane 2 includes a traveling truck 16 that travels in the transport space S1 in the width direction Y, a mast 17 provided upright on the traveling truck 16, an elevating body 18 that moves up and down along the mast 17, and a transfer device 19 supported by the elevating body 18.

The transfer device 19 moves along the width direction Y by the traveling truck 16 traveling, and moves in the up-down direction Z along the mast 17 by the elevating body 18 moving up and down. Although a detailed description has been omitted, the transfer device 19 includes a support platform that supports the container W, and a link mechanism that moves the support platform along the front-rear direction X, and the transfer device 19 is configured to be able to transfer the container W between itself and the storage section 1a. As for the traveling truck 16, at least a part of the traveling truck 16 is located below the lowermost support portion 9 and a limiting body 47, which will be described later. In the present embodiment, the whole of the traveling truck 16 is located below the lowermost support portion 9 and the limiting body 47.

The traveling truck 16 travels on the traveling rail 20 along the width direction Y. In the present embodiment, the whole of the traveling truck 16 is located below the support portion 9 provided in the lowermost storage section 1a, and is located below the upper floor portion F2.

The upper end portion of the mast 17 is guided by guide rails 21 so as to move along the width direction Y. To give an additional description, the guide rails 21 are provided above the uppermost storage section 1a in an orientation along the width direction Y, and the guide rails 21 are installed so as to be spaced apart in the front-rear direction X. Then, the upper end portion of the mast 17 is located between the pair of guide rails 21, and the mast 17 is guided in the width direction Y in a state in which its movement in the front-rear direction X is limited by the pair of guide rails 21.

Gas Supply Device

As shown in FIGS. 2 and 3, the gas supply device 3 includes a main pipe (not shown) connected to a gas supply source (not shown), a plurality of vertical pipes 24 branched from the main pipe, and a plurality of branch pipes 25 branched from the vertical pipes 24. The dry air from the gas supply source flows through the main pipe, the vertical pipe 24, and the branch pipe 25 in this order, and the container W is supplied to each storage section 1a. The main pipe is provided, for example, below the lowermost storage section 1a along the width direction Y.

Each of the plurality of vertical pipes 24 is provided along the up-down direction Z. Each of the plurality of vertical pipes 24 is provided so as to extend upward from the main pipe. Each vertical pipe 24 is provided so as to extend through the through portion 14 formed in the support member 5. In other words, the vertical pipe 24 is installed so as to be located between the support portion 9 and the rack frame body 6 within a width, in the width direction Y, of the support portion 9 of the support member 5.

Wall Member

As shown in FIG. 1, the wall member K covers a side periphery of an installation space in which the article storage rack 1 and the stacker crane 2 are installed, in a state in which passage of air is limited. The wall member K includes an overfloor wall 31 and an underfloor wall 32. The overfloor wall 31 is located above the upper surface of the upper floor portion F2 and below the lower surface of the lower ceiling portion C2. The underfloor wall 32 is located below the lower surface of the upper floor portion F2 and above the upper surface of the lower floor portion F1.

The overfloor wall 31 includes a four-surface overfloor wall portion 31a that is formed in a quadrangular tube shape. FIG. 1 shows an overfloor wall portion 31a that closes a side of the installation space in one direction in the front-rear direction X, and an overfloor wall portion 31a that closes a side of the installation space in the other direction in the front-rear direction X.

The underfloor wall 32 includes a four-surface underfloor wall portion 32a that is formed in a quadrangular tube shape. FIG. 1 shows an underfloor wall portion 32a that closes a side of the installation space in one direction in the front-rear direction X, and the underfloor wall portion 32a that closes a side of the installation space in the other direction in the front-rear direction X.

Figure 4:
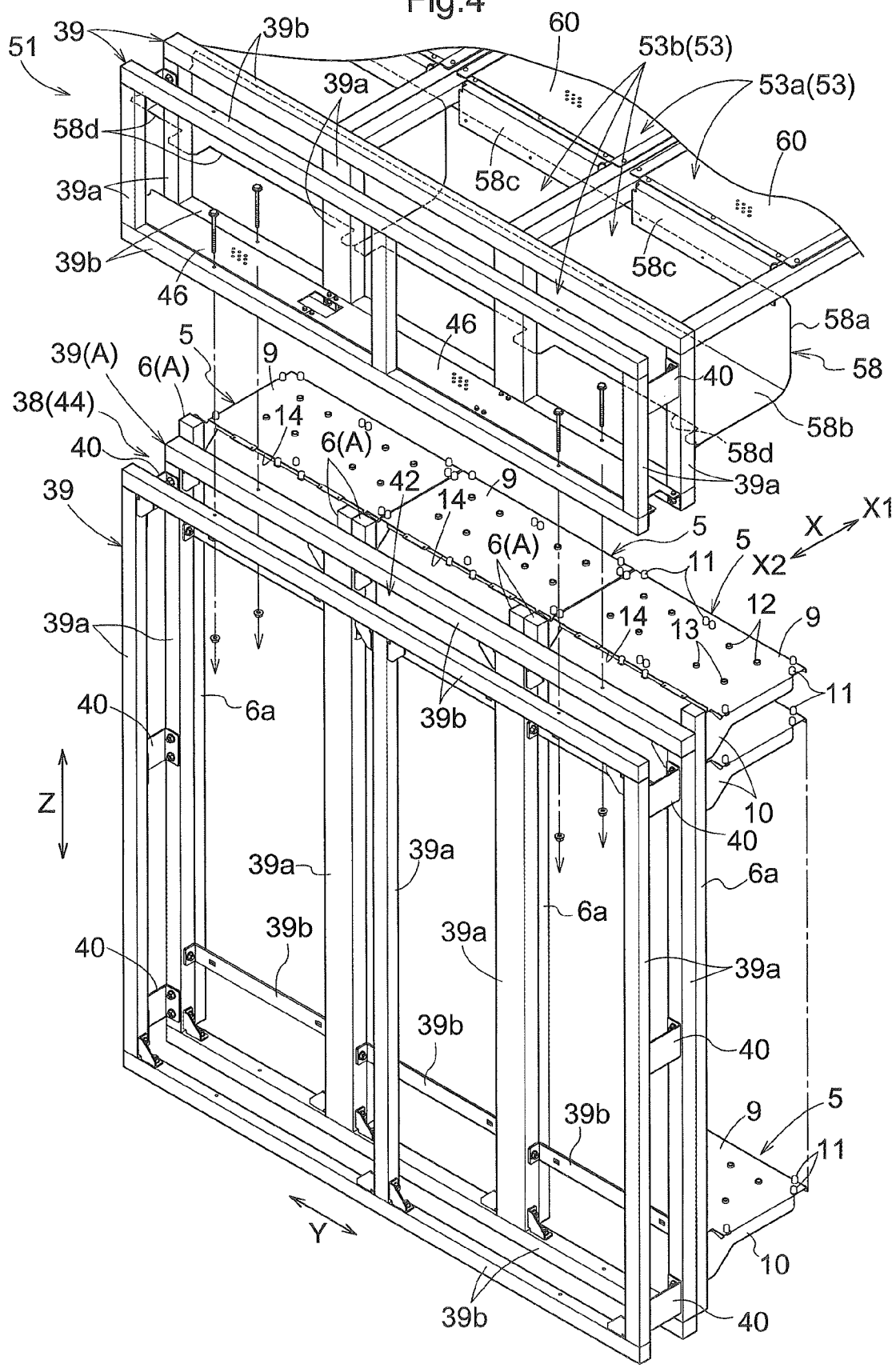
FIG. 4 is an exploded perspective view of a flow path portion and a guide portion.

As shown in FIGS. 2 to 4, a rear frame body 38 is provided at the rear X2 of the article storage rack 1. The rear frame body 38 includes a pair of grid frames 39 aligned in the front-rear direction X, and a coupling frame 40 that couples the pair of grid frame 39. Each of the pair of grid frames 39 is formed in a grid-like combination of longitudinal frames 39a in an orientation along the up-down direction Z and lateral frames 39b in an orientation along the width direction Y. The pair of grid frames 39 are installed so as to be spaced apart in the front-rear direction X, and the pair of grid frames 39 are coupled by a coupling frame 40 installed in an orientation extending in the front-rear direction X.

By forming the grid frame 39 as a grid-like combination of the longitudinal frames 39a and the lateral frames 39b, the grid frame 39 has rectangular holes extending therethrough in the front-rear direction X. The overfloor wall portion 31a is formed to be non-porous, and is installed so as to close, from the rear X2, the rectangular holes of the grid frame 39 of the pair of grid frames 39 that is located rearward X2. By installing the overfloor wall portion 31a in this manner, the overfloor wall portion 31a is installed so as to be spaced apart rearwardly X2 from the plurality of storage sections 1a, and closes the rear X2 of the article storage rack 1 in a state in which gas ventilation is limited.

The rack frame body 6 is coupled to the grid frame 39 (hereinafter occasionally referred to as a "front grid frame 39") of the pair of grid frames 39 that is located forward X1. That is, the rear frame body 38 and the rack frame body 6 are installed such that the rear frame body 38 and the rack frame body 6 are aligned in the front-rear direction X in a state in which the rear frame body 38 is located rearward X2 relative to the rack frame body 6.

Flow Path Portion

As shown in FIGS. 2 and 3, a flow path portion 42 is installed at the rear X2 of the article storage rack 1.

The flow path portion 42 includes a flow path wall portion 43 that covers the rear X2 of the article storage rack 1 in a state in which gas ventilation is limited, and a flow path frame body 44 that supports the flow path wall portion 43. The flow path wall portion 43 is constituted by a part of the overfloor wall portion 31a that is located below a guide portion 54, which will be described later. The flow path frame body 44 is constituted by a part of the rear frame body 38 that is located below the guide portion 54, which will be described later. Accordingly, the flow path wall portion 43 is installed so as to be spaced apart rearwardly X2 from the plurality of storage sections 1a.

A flow path space S2 extending in the up-down direction Z is formed between the flow path wall portion 43 and the plurality of storage sections 1a. To give an additional description, the pair of grid frames 39 are installed between the flow path wall portion 43 and the plurality of storage sections 1a in the front-rear direction X, and the main flow path space S2a is formed between the pair of grid frames 39. The air flowing through the main flow path space S2a flows between the pair of grid frames 39.

A through portion 14 extending through the support member 5 in the up-down direction Z is formed between the flow path wall portion 43 and each of the plurality of storage sections 1*a* in the front-rear direction X. As a result of the plurality of support members 5 being aligned in the up-down direction Z, the through portions 14 form a sub-flow path space S2*b*. The air flowing through the sub-flow path space S2*b* flows through the through portions 14.

Then, the main flow path space S2*a* and the sub-flow path space S2*b* are in communication with each other in the front-rear direction X. To give an additional description, the rack frame body 6 and the front grid frame 39 are present between the main flow path space S2*a* and the sub-flow path space S2*b*, and each of the rack frame body 6 and the front grid frame 39 is formed in a grid shape by combining longitudinal members and lateral members. Accordingly, the rack frame body 6 and the front grid frame 39 each have rectangular holes extending therethrough in the front-rear direction X. The main flow path space S2*a* and the sub-flow path space S2*b* are in communication with each other in the front-rear direction X via the rectangular holes.

Thus, the flow path space S2 includes the main flow path space S2*a* extending in the up-down direction Z, and the sub-flow path space S2*b* that is located forward X1 relative to the main flow path space S2*a* and is in communication with the main flow path space S2*a*. Then, the frame body A (composed of the rack frame body 6 and the front grid frame 39) is provided between the main flow path space S2*a* and the sub-flow path space S2*b*, and the frame body A located between the main flow path space S2*a* and the sub-flow path space S2*b* is formed by combining, into a grid shape, the plurality of longitudinal frames 6*a* and 39*a* in an orientation extending in the up-down direction Z and the plurality of lateral frames 6*b* and 39*b* in an orientation extending in the width direction Y.

Figure 5:
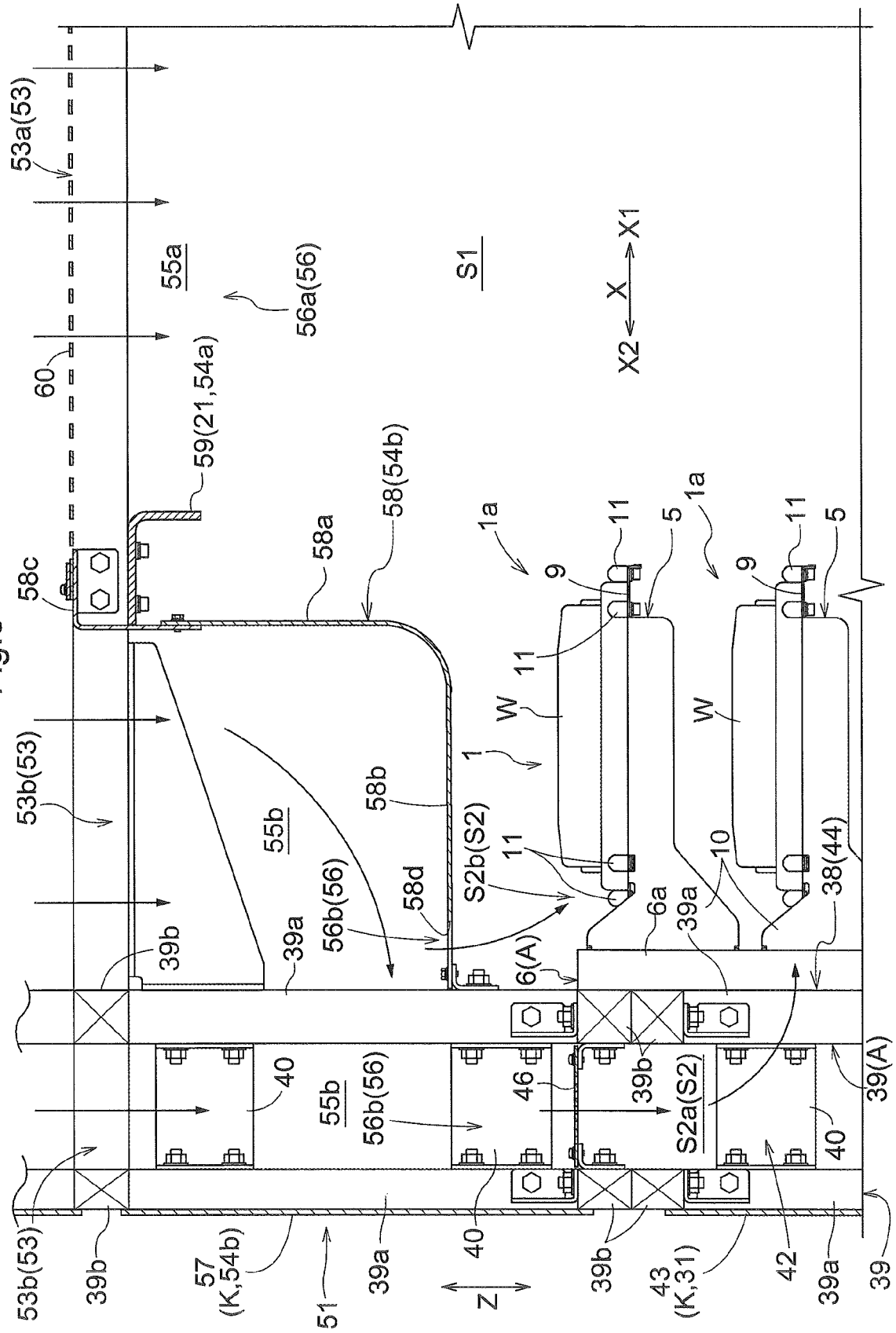
FIG. 5 is a side view of the guide portion.

As shown in FIG. 5, the lateral frame 39*b* located at the top of the front grid frame 39 is installed in an orientation extending in the width direction Y between the main flow path space S2*a* and the sub-flow path space S2*b* so as to partly partition the main flow path space S2*a* and the sub-flow path space S2*b* in the front-rear direction X, and is provided at a portion in the up-down direction Z.

Then, assuming that the support member 5 (the support member 5 that partitions the uppermost storage section 1*a* of the plurality of storage sections 1*a* and the storage section 1*a* downwardly adjacent to that storage section 1*a*) that supports the container W stored in the uppermost storage section 1*a* of the plurality of storage sections 1*a* is the uppermost support member 5, the lateral frame 39*b* located at the top of the front grid frame 39 is installed at the same height as the uppermost support member 5.

Note that the lateral frame 39*b* located at the tope of the front grid frame 39 corresponds to the front-rear partition body, and is constituted by a part of the frame body A. The support member 5 is supported by the frame body A.

As shown in FIGS. 1 to 3, an air rectifying body 46 that closes the flow path space S2 in a state in which ventilation is possible as viewed in the up-down direction Z is disposed at at least one location in the flow path portion 42 in the up-down direction Z of the flow path space S2. In the present embodiment, the air rectifying body 46 is constituted by a so-called punched metal, which is a metal plate-shaped member having many small holes, and a plurality of air rectifying bodies 46 are provided in the flow path space S2 so as to be aligned in the up-down direction Z. Then, a punched metal whose pore ratio decreases as the arrangement height moves downward is used for the plurality of air rectifying bodies 46, and the plurality of air rectifying bodies 46 are configured such that the opening ratio of the flow path space S2 decreases as the arrangement height moves downward. In the present embodiment, three air rectifying bodies 46 are provided in the flow path space S2 so as to be aligned in the up-down direction Z, and the opening ratios of the flow path space S2 provided by the three air rectifying bodies 46 are 80%, 70%, and 60% from the top. Note that the air rectifying bodies 46 are provided only in the main flow path space S2*a*, and not provided in the sub-flow path space S2*b*.

The air rectifying body 46 located at the top of the plurality of air rectifying bodies 46 is installed above the upper surface of the support portion 9 of the uppermost support member 5, and is installed so as to be located within the vertical width of the container W supported by the uppermost support member 5.

As shown in FIG. 1, a limiting body 47 that covers a lower portion of the flow path space S2 in a state in which gas ventilation is limited in the up-down direction Z is provided below the lowermost storage section 1*a* of the plurality of storage sections 1*a* and above a gas exhaust portion 52. The limiting body 47 extends from the flow path wall portion 43 toward the front X1 to a position at which the limiting body 47 overlaps the lowermost storage section 1*a* as viewed in the up-down direction Z.

To give an additional description, an inclined wall portion 48 is provided at a lower end portion of the flow path space S2. In addition, a horizontal wall 49 is provided, and the inclined wall portion 48 and the horizontal wall 49 constitute the limiting body 47.

As shown in FIG. 1, the article storage facility further includes a gas supply portion 51 and a gas exhaust portion 52.

The gas supply portion 51 is provided above the transport space S1, the flow path space S2, and the plurality of storage sections 1*a*. The gas supply portion 51 includes a flow inlet 53 from which an air flow from the outside flows in, and is in communication with an upper end portion of the transport space S1 and an upper end portion of the flow path space S2. The gas exhaust portion 52 is provided below the flow path space S2 and the plurality of storage sections 1*a*. The gas exhaust portion 52 is in communication with a lower end portion of the transport space S1.

Gas Supply Portion

Figure 6:
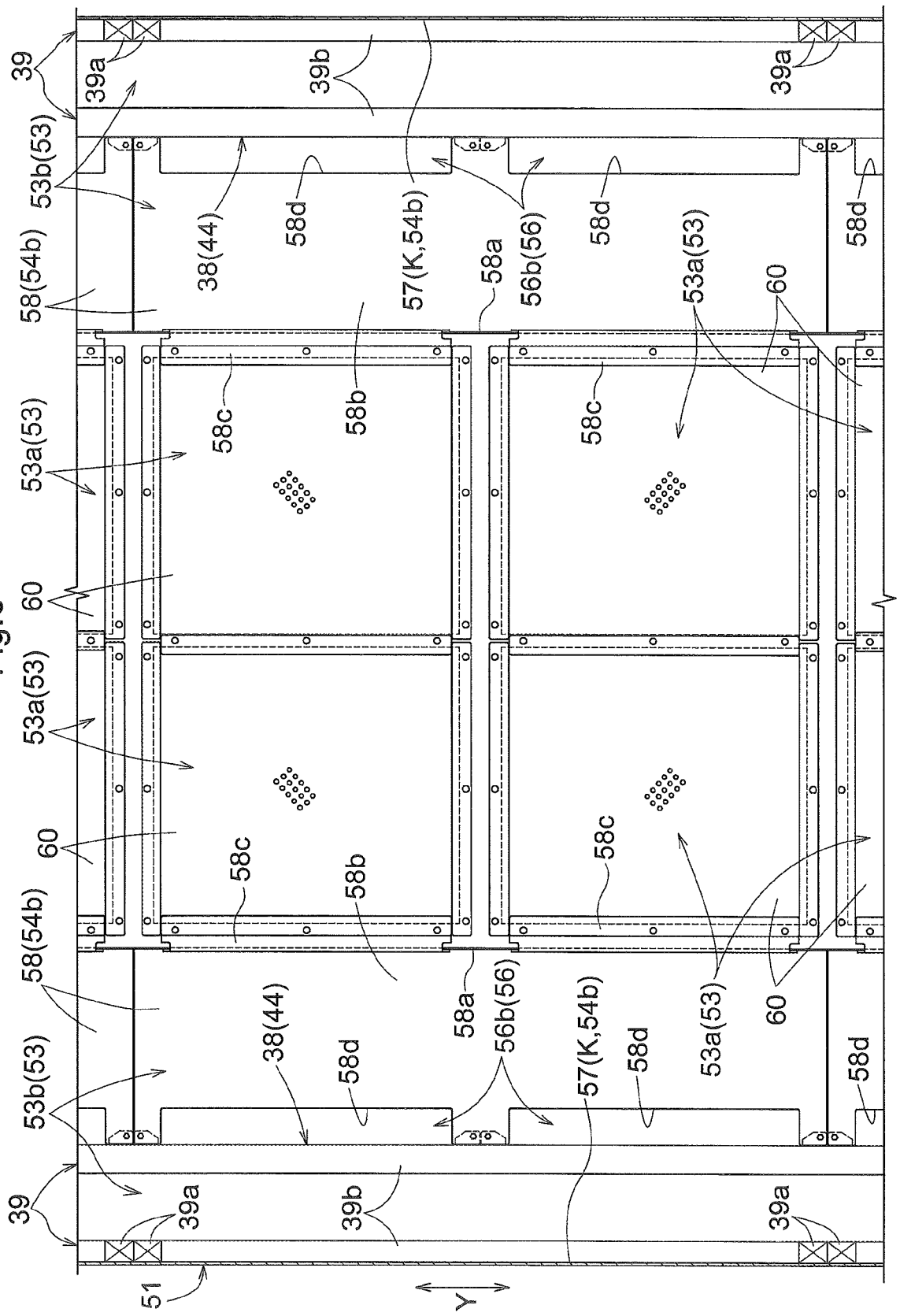
FIG. 6 is a plan view of the article storage facility.
Figure 7:
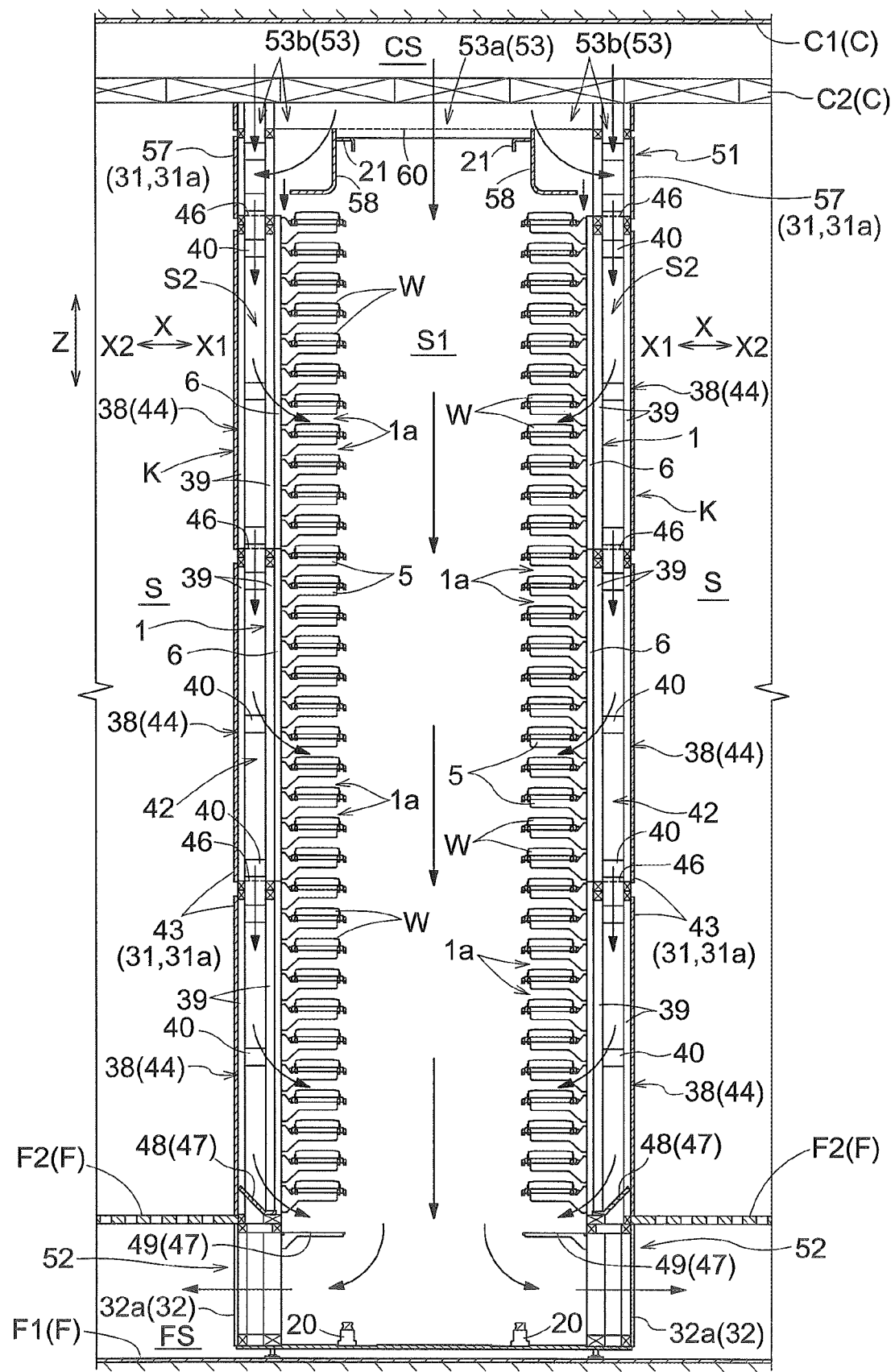
FIG. 7 is a diagram illustrating a flow of air in the article storage facility.

As shown in FIGS. 4 to 6, the gas supply portion 51 includes a guide portion 54 that guides the air that has flowed in from the flow inlet 53 to the upper end portion of the transport space S1 and the upper end portion of the flow path space S2 such that the air pressure inside the transport space S1 is smaller than the air pressure inside the flow path space S2. The guide portion 54 is installed above the article storage rack 1 and the flow path portion 42 and below the lower ceiling portion C2.

The guide portion 54 includes a first guide body 54*a* that forms a first flow path 55*a* in communication with the upper end portion of the transport space S1, and a second guide body 54*b* that forms a second flow path 55*b* in communication with the upper end portion of the flow path space S2. A first flow inlet 53*a* for allowing air to flow into the first flow path 55*a* and a second flow inlet 53*b* for allowing air to flow into the second flow path 55*b* are provided as the flow inlet 53, and the first flow inlet 53*a* and the second flow inlet 53*b* open upwardly. The guide portion 54 includes a first flow outlet 56*a* for allowing the air in the first flow path 55*a* to flow out to the upper end portion of the transport space S1, and a second flow outlet 56*b* for allowing the gas in the second flow path 55*b* to flow out to the upper end portion of the flow path space S2. Note that the first flow inlet 53a and the second flow inlet 53b are formed at the same height.

The air that has flowed in from the first flow inlet 53a passes through the first flow path 55a, and flows out from the first flow outlet 56a to the upper end portion of the transport space S1. The air that has flowed in from the second flow inlet 53b passes through the second flow path 55b, and flows out from the second flow outlet 56b to the upper end portion of the flow path space S2.

The second guide body 54b includes a first wall portion 57 constituted by a part of the overfloor wall portion 31a that is located above the flow path portion 42, and a second wall portion 58 installed forward X1 relative to the first wall portion 57.

The first wall portion 57 and the second wall portion 58 are installed such that an interval therebetween in the front-rear direction X decreases downwardly. To give an additional description, the second wall portion 58 includes a longitudinal wall portion 58a extending in the up-down direction Z and the width direction Y, a first lateral wall portion 58b extending rearwardly X2 from the lower end of the longitudinal wall portion 58a, and a second lateral wall portion 58c extending forwardly X1 from the upper end of the longitudinal wall portion 58a. The rear end of the first lateral wall portion 58b is coupled to the grid frame 39 of the pair of grid frames 39 that is located forward X1. The longitudinal wall portion 58a is located so as to be spaced apart forwardly X1 by a set distance from the grid frame 39 of the pair of grid frames 39 that is located forward X1. The set distance is set to be about three times the clearance between the pair of grid frames 39 in the front-rear direction X. A recessed portion 58d recessed forwardly X1 from the rear end is formed in the first lateral wall portion 58b of the second wall portion 58. The recessed portion 58d is recessed by an amount corresponding to about half the clearance between the pair of grid frames 39 in the front-rear direction X.

A portion that couples the longitudinal wall portion 58a to the first lateral wall portion 58b is formed in an arc shape in which a portion closer to the lower side is located toward the rear X2, and has a shape that guides a downwardly flowing air to the rear X2. Thus, the first wall portion 57 and the second wall portion 58 are installed such that an interval therebetween in the front-rear direction X decreases downwardly, mainly at the lower portions.

A second flow path 55b is formed between the first wall portion 57 and the second wall portion 58.

Then, a second flow inlet 53b is formed between the upper end of the first wall portion 57 and the upper end of the second wall portion 58. To give an additional description, a pair of grid frames 39 are formed between the first wall portion 57 and the second wall portion 58, and a second flow inlet 53b is formed between the pair of grid frames 39 at the same height as the upper end of the first wall portion 57 and the upper end of the second wall portion 58. A second flow inlet 53b is also formed between the grid frame 39 of the pair of grid frames 39 that is located forward X1 and the upper end of the second wall portion 58.

A second flow outlet 56b is formed between the lower end of the first wall portion 57 and the lower end of the second wall portion 58. To give an additional description, a second flow outlet 56b is formed between the pair of grid frames 39 at the same height as the lower end of the first wall portion 57 and the lower end of the second wall portion 58. At a portion in the width direction Y at which the recessed portion 58d is formed, a second flow outlet 56b is also formed between the grid frame 39 of the pair of grid frames 39 that is located forward X1 and the first lateral wall portion 58b as a result of the recessed portion 58d being formed. Then, the second flow inlet 53b has a larger opening area than the second flow outlet 56b.

The first guide body 54a is composed of a pair of third wall portions 59. Each of the pair of third wall portions 59 includes a guide rail 21 and a part of the second wall portion 58 that is located above the guide rail 21. A first flow path 55a is formed between the pair of third wall portions 59. Then, a first flow inlet 53a is formed between the upper ends of the pair of third wall portions 59. A first flow outlet 56a is formed between the lower ends of the pair of third wall portions 59.

The first flow inlet 53a has a larger opening area than the first flow outlet 56a. A closing body 60 that closes the second flow inlet 53b in a state in which ventilation is possible as viewed in the up-down direction Z is provided. The closing body 60 is formed of a punched metal.

The size of the second flow inlet 53b in the front-rear direction X (the total size of the two second flow inlets 53b that are aligned in the front-rear direction X and are formed between the upper end of the first wall portion 57 and the upper end of the second wall portion 58) is larger than the size of the flow path space S2 in the front-rear direction X (the size of the main flow path space S2a in the front-rear direction X plus the size of the sub-flow path space S2b in the front-rear direction X), and the size of the second flow inlet 53b in the width direction Y is the same as the size of the flow path space S2 (the main flow path space S2a) in the width direction Y. Accordingly, the opening area of the second flow inlet 53b is larger than the cross-sectional area of the sub-flow path space S2b.

The size of the first flow inlet 53a in the front-rear direction X is the same as the size of the transport space S1 in the front-rear direction X, and the size of the first flow inlet 53a in the width direction Y is the same as the size of the transport space S1 in the width direction Y. Accordingly, the opening area of the first flow inlet 53a is the same as the cross-sectional area of the transport space S1.

By forming the second flow inlet 53b and the first flow inlet 53a in such sizes, the air flow rate per unit area at the upper end portion of the transport space S1 is larger than the air flow rate per unit area at the upper end portion of the flow path space S2, and the air pressure in the flow path space S2 is higher than the air pressure in the transport space S1.

The first flow inlet 53a and the first flow outlet 56a are formed at a position that overlaps the upper end of the transport space S1 as viewed in the up-down direction Z. The second flow inlet 53b and the second flow outlet 56b are formed at a position that overlaps the flow path space S2 as viewed in the up-down direction Z. In particular, the second flow inlet 53b and the second flow outlet 56b formed between the pair of grid frames 39 are formed at a position that overlaps the main flow path space S2a as viewed in the up-down direction Z. The second flow inlet 53b formed between the grid frame 39 and the second wall portion 58, and the second flow outlet 56b formed between the grid frame 39 and the first lateral wall portion 58b are formed at a position that overlaps the sub-flow path space S2b as viewed in the up-down direction Z.

Gas Exhaust Portion

The underfloor wall portion 32a is formed so as to be permeable in the front-rear direction, and the air that has flowed below the upper floor portion F2 through the transport space S1 flows out from the underfloor wall portion 32a to the outside. That is, the underfloor wall portion 32a functions as the gas exhaust portion 52, and the gas exhaust portion 52 is installed below the upper floor portion F2.

Thus, the air that has flowed in from the flow inlet 53 of the gas supply portion 51 flows to the upper end portion of the flow path space S2 and the upper end portion of the transport space S1 such that the air pressure inside the transport space S1 is smaller than the air pressure inside the flow path space S2. Then, the air flowing downwardly through the flow path space S2 flows downwardly through both the main flow path space S2a and the sub-flow path space S2b, and spreads through the plurality of storage sections 1a and merges in the transport space S1. The air flowing downwardly through the transport space S1 flows outwardly through the space between the limiting body 47 and the lower floor portion F1, and thereafter flows out from the gas exhaust portion 52 to the outside.

Alternative Embodiments (1) In the above-described embodiment, the gas supply portion is installed below the ceiling including the flow outlet for allowing a gas to flow out downwardly, thus allowing the gas that has flowed out from the flow outlet of the ceiling to flow in from the flow inlet. However, a blower device such as a fan filter unit may be installed at the flow inlet, and the gas may be allowed to flow in from the flow inlet by the air blowing effect of the blower device.

Then, when the blower device is installed in this manner, the flow-in amount that is allowed to flow in by the blower device installed at the second flow inlet (the flow-in amount per unit area in the flow path space) is set to be larger than the flow-in amount that is allowed to flow in by the blower device installed at the first flow inlet (the flow-in amount per unit area in the transport space). Thereby, the gas that has flowed in from the flow inlet is guided to the upper end portion of the flow path space and the upper end portion of the transport space by the guide portion such that the air pressure inside the transport space is smaller than the air pressure inside the flow path space. When the blower device is installed at the flow inlet in this manner, one or both of the first flow inlet and the second flow inlet may be opened toward the lateral side.

(2) Although the opening area of the first flow inlet is larger than the opening area of the first flow outlet in the above-described embodiment, the opening area of the first flow inlet may be the same or smaller than the opening area of the first flow outlet.

Although the opening area of the second flow inlet is larger than the opening area of the second flow outlet in the above-described embodiment, the opening area of the second flow inlet may be the same or smaller than the opening area of the second flow outlet.

(3) Although the closing body that closes the second flow inlet in a state in which ventilation is possible is provided in the above-described embodiment, such a closing body does not need to be provided at the second flow inlet. Alternatively, a closing body that closes a part or all of the first flow inlet, the first flow outlet, and the second flow outlet in a state in which ventilation is possible may be provided.

(4) In the above-described embodiment, the through portion is formed in the support member so as to form the sub-flow path space, and the sub-flow path space is provided in the flow path space. However, the through portion may not be formed in the support member, and the sub-flow path space does not need to be provided in the flow path space.

(5) Although the support portion that supports the article from below is used as the up-down partition body in the above-described embodiment, a member separate from the support portion may be provided as the up-down partition body. When the support portion is used as the up-down partition body, it is also possible to use a support portion obtained by cutting out a part of the support portion in a U-shape so as to be able to scoop the container from below the support portion.

(6) Although the lateral member of the frame body is used as the front-rear partition body in the above-described embodiment, a member separate from the lateral member of the frame body may be provided as the front-rear partition body.

(7) In the above-described embodiment, a plurality of the air rectifying bodies are provided in the flow path space. However, only one air rectifying body may be provided in the flow path space, or no air rectifying body may be provided in the flow path space.

When a plurality of air rectifying bodies are provided in the flow path space, the opening ratios of the flow path space at locations where the air rectifying bodies are installed may be changed as needed. For example, the plurality of air rectifying bodies may have a shape that provides the same opening ratio of the flow path space even when the installation height is changed.

(8) Although the limiting body that covers a lower portion of the flow path space is provided below the lowermost storage section and above the gas exhaust portion in the above-described embodiment, the flow path space and the underfloor space may be in direct communication with each other without providing the limiting body.

(9) Although the article is a container that stores a reticle (photomask) in the above-described embodiment, the container may be a container of another type such as a container that stores a semiconductor wafer such as a FOUP, or an article other than a container may be used.

(10) Although the gas supplied from the gas supply portion is air in the above-described embodiment, the gas may be a gas other than air, including, for example, an inactive gas such as a nitrogen gas or an argon gas.

Outline of the Embodiment

The following is a description of an outline of the article storage facility described above.

A characteristic feature of a article storage facility includes: an article storage rack including a plurality of storage sections aligned in an up-down direction; a transport device that transports an article to the storage sections; and a wall portion that covers a rear of the article storage rack in a state in which gas ventilation is limited, wherein a transport space extending in the up-down direction is formed in front of the article storage rack, and the transport device is installed in the transport space;

the article storage rack includes a plurality of up-down partition bodies that partition the storage sections adjacent to each other in the up-down direction in a state in which gas ventilation is limited; the wall portion is installed so as to be spaced apart in a rearward direction from the plurality of storage sections and a flow path space extending in the up-down direction is formed between the wall portion and the plurality of storage sections; in a front-rear direction in which the article storage rack and the transport space are aligned as viewed in the up-down direction, each of the plurality of storage sections is located between the flow path space and the transport space and is in communication with the flow path space and the transport space; the article storage facility further includes a gas supply portion provided above the transport space, the flow path space, and the plurality of storage sections, and a gas exhaust portion provided below the flow path space and the plurality of storage sections; the gas supply portion includes a flow inlet in which a gas from outside flows, and is in communication with an upper end portion of the transport space and an upper end portion of the flow path space; the gas exhaust portion is in communication with a lower end portion of the transport space; and the gas supply portion includes a guide portion that guides a gas that has flowed in from the flow inlet to the upper end portion of the flow path space and the upper end portion of the transport space such that an air pressure inside the transport space is smaller than an air pressure inside the flow path space.

According to this characteristic feature, the gas that has flowed in from the flow inlet flows to the upper end portion of the flow path space and the upper end portion of the transport space such that the air pressure inside the transport space is smaller than the air pressure inside the flow path space. Accordingly, a gas can easily flow from the flow path space having a high air pressure toward the transport space having a low air pressure without providing a blower device for each of the storage sections and forcefully blowing a gas from the flow path space toward the transport space. Therefore, a gas can easily flow from the flow path space toward the transport space not only on the downstream side of the flow path space where a gas can relatively easily flow toward the transport space, but also on the upstream side of the flow path space where a gas is relatively difficult to flow toward the transport space. Accordingly, for example, when the transport device is operated, a gas is difficult to flow back from the transport space toward the flow path space in the storage section of the plurality of storage sections aligned in the up-down direction that is located upward. Since the gas from the flow path space can easily flow in on the upstream side of the transport space, the amount of the gas flowing downwardly on the upstream side of the transport space is increased, so that dust can be easily moved downwardly on the upstream side of the transport space in an appropriate manner.

Thus, the omission of the blower device in the storage sections makes it possible to inhibit a backflow of a gas from the transport space to the storage sections and easily cause dust to flow downwardly on the upstream side of the transport space in an appropriate manner, while suppressing the running cost.

Here, it is preferable that the gas supply portion installed directly below a ceiling including a flow outlet for allowing a gas to flow out downwardly, the guide portion of the gas supply portion includes a first guide body that forms a first flow path in communication with the upper end portion of the transport space, and a second guide body that forms a second flow path in communication with the upper end portion of the flow path space, a first flow inlet for allowing a gas to flow into the first flow path and a second flow inlet for allowing a gas to flow into the second flow path are provided as the flow inlet, and the first flow inlet and the second flow inlet are open upwardly.

With this configuration, a gas flowing out from the flow outlet provided on the ceiling flows into the upwardly opening first flow inlet and second flow inlet. The gas that has flowed in from the first flow inlet passes through the first flow path and flows to the upper end portion of the transport space, and the gas that has flowed in from the second flow inlet passes through the second flow path and flows to the upper end portion of the flow path space. Accordingly, it is not necessary to separately install a blower device for allowing the gas to flow in from the first flow inlet and the second flow inlet, or it is only necessary to provide a blower device with a small air flowing capacity if needed, so that the running cost of the article storage facility can be suppressed.

It is preferable that the guide portion includes a second flow outlet for allowing a gas inside the second flow path to flow out into the flow path space, and an opening area of the second flow inlet is larger than an opening area of the second flow outlet.

With this configuration, the opening area of the second flow inlet is larger than the opening area of the second flow outlet, and therefore, it is possible to allow a large amount of gas to flow in from the second flow inlet, which is relatively large. Then, the air pressure inside the flow path space can be more easily increased, for example, by setting the opening area of the second flow outlet to a size corresponding to the cross-sectional area of the flow path space, and allowing the air that has flowed in from the second flow inlet having a relatively large opening area to flow from the second flow outlet to the flow path space.

It is preferable that a closing body that closes the first flow inlet in a state in which ventilation is possible as viewed in the up-down direction is provided.

With this configuration, the first flow inlet is closed in a state in which ventilation is possible by the closing body, and thereby, a gas is difficult to flow in from the first flow inlet into the first flow path, so that it is possible to suppress the amount of gas flowing from the first flow path to the transport space. Accordingly, the air pressure inside the transport space can be easily lowered.

It is preferable that the flow path space includes a main flow path space extending in the up-down direction, and a sub-flow path space that is located forward relative to the main flow path space and is in communication with the main flow path space in the front-rear direction, the article storage facility includes, between the main flow path space and the sub-flow path space, a front-rear partition body that is installed in an orientation extending in a width direction intersecting the front-rear direction as viewed in the up-down direction so as to partly partition the main flow path space and the sub-flow path space in the front-rear direction, and is provided at a portion in the up-down direction, the up-down partition body that partitions the uppermost storage section of the plurality of storage sections and a storage section adjacent to a lower portion of the uppermost storage section is used as an uppermost up-down partition body, and the front-rear partition body is installed at the same height as the uppermost up-down partition body or at a higher height than the uppermost up-down partition body.

With this configuration, a part of the gas that has flowed downwardly from above the front-rear partition body toward the front-rear partition body passes in front of the front-rear partition body and flows through the sub-flow path space. Then, the front-rear partition body is installed at the same height as the uppermost up-down partition body or at a higher height than the uppermost up-down partition body. Thus, the gas flowing downwardly in the flow path space is guided forwardly by the up-down partition body, and thus can easily flow above the uppermost up-down partition body toward the transport space. Accordingly, a gas can easily flow to the uppermost storage section where a gas is relatively difficult to flow.

It is preferable that a frame body is provided between the main flow path space and the sub-flow path space, the frame body is formed by a grid-like combination of a plurality of longitudinal members in an orientation extending in the up-down direction and a plurality of lateral members in an orientation extending in the width direction, the up-down partition body is supported by the frame body, and the front-rear partition body is constituted by a part of the lateral members of the frame body.

With this configuration, the lateral members installed in an orientation extending in the width direction between the main flow path space and the sub-flow path space are present on the frame body installed between the main flow path space and the sub-flow path space. By using the lateral members as the front-rear partition bodies, it is not necessary to provide a dedicated member for partly partitioning the main flow path space and the sub-flow path space in the front-rear direction, making it possible to simplify the configuration of the article storage facility.

It is preferable that the up-down partition body is formed in a plate shape extending in the front-rear direction and the width direction, the up-down partition body is supported in a cantilevered manner by the frame body in a state in which a rear end portion of the up-down partition body is coupled to the frame body, and the up-down partition body includes a support portion that supports, from below, articles stored in the storage sections, and also includes, in a portion located rearward relative to the support portion, a through portion extending therethrough in the up-down direction.

With this configuration, by supporting an article by the support portion of the up-down partition body from below, a member for supporting an article does not need to be separately provided at the article storage rack, so that it is possible to simplify the configuration of the article storage rack. Further, by providing the through portions in the plurality of up-down partition bodies aligned in the up-down direction, the sub-flow path space can be formed by the through portions aligned in the up-down direction. Accordingly, it is not necessary to combine, for example, a frame member and a plate member to form the sub-flow path space, and therefore, the sub-flow path space can be easily formed.

It is preferable that an air rectifying body that closes the flow path space in a state in which ventilation is possible as viewed in the up-down direction is disposed at at least one location of the flow path space in the up-down direction.

With this configuration, at the height at which the air rectifying body is installed in the flow path space, the presence of the air rectifying body makes it difficult for a gas to flow downwardly in the flow path space, so that a gas can easily flow toward the storage section. That is, when there is a storage section to which a gas is difficult to flow from the flow path space, the air rectifying body is installed so as to allow a gas to easily flow to that storage section, thus making the gas flowing from the flow path space to the plurality of storage sections uniform.

It is preferable that a plurality of the air rectifying bodies are provided so as to be aligned in the up-down direction in the flow path space, and the plurality of air rectifying bodies have a shape that decreases an opening ratio of the flow path space as an arrangement height thereof moves downward.

With this configuration, as the arrangement height moves downward, a gas is more difficult to be ventilated at the height at which the air rectifying body is installed. That is, it is possible to maintain the state in which a gas flows toward the storage section at a relatively high portion of the flow path space by increasing the opening ratio of the flow path space by the air rectifying body, while preventing a shortage of the gas amount at a relatively low portion of the flow path space. At a relatively low portion of the flow path space, a gas can more easily flow toward the storage section in an appropriate manner by decreasing the opening ratio of the flow path space by the air rectifying body.

It is preferable that the article storage facility includes: below the lowermost storage section of the plurality of storage sections and above the gas exhaust portion, a limiting body that covers a lower portion of the flow path space in a state in which gas ventilation is limited, and the limiting body extends forwardly from the wall portion to a position that overlaps the lowermost storage section as viewed in the up-down direction.

With this configuration, the gas that has flowed downwardly in the flow path space relative to the lowermost storage section is allowed to flow toward the transport space, instead of being discharged downwardly from the flow path space, and thereby, the amount of the gas flowing downwardly in the transport space can be increased. Accordingly, it is possible to inhibit dust from swirling up in the transport space.

The technique according to the present disclosure is applicable to an article storage facility including an article storage rack, a transport device, and a wall portion that covers the rear of the article storage rack.

The invention claimed is:

1. An article storage facility comprising:
an article storage rack including a plurality of storage sections aligned in an up-down direction;
a transport device that transports an article to the storage sections; and
a wall portion that covers a rear of the article storage rack in a state in which gas ventilation is limited, wherein:
a transport space extending in the up-down direction is formed in front of the article storage rack, and the transport device is installed in the transport space;
the article storage rack includes a plurality of up-down partition bodies that partition the storage sections adjacent to each other in the up-down direction in a state in which gas ventilation is limited;
the wall portion is installed so as to be spaced apart in a rearward direction from the plurality of storage sections and a flow path space extending in the up-down direction is formed between the wall portion and the plurality of storage sections;
in a front-rear direction in which the article storage rack and the transport space are aligned as viewed in the up-down direction, each of the plurality of storage sections is located between the flow path space and the transport space and is in communication with the flow path space and the transport space;
the article storage facility further comprises a gas supply portion provided above the transport space, the flow path space, and the plurality of storage sections, and a gas exhaust portion provided below the flow path space and the plurality of storage sections;
the gas supply portion includes a flow inlet in which a gas from outside flows, and is in communication with an upper end portion of the transport space and an upper end portion of the flow path space;
the gas exhaust portion is in communication with a lower end portion of the transport space;
the gas supply portion includes a guide portion that guides a gas that has flowed in from the flow inlet to the upper end portion of the flow path space and the upper end portion of the transport space such that an air pressure inside the transport space is smaller than an air pressure inside the flow path space;

the gas supply portion is installed directly below a ceiling including a flow outlet for allowing a gas to flow out downwardly;

the guide portion of the gas supply portion includes a first guide body that forms a first flow path in communication with the upper end portion of the transport space, and a second guide body that forms a second flow path in communication with the upper end portion of the flow path space;

a first flow inlet for allowing a gas to flow into the first flow path and a second flow inlet for allowing a gas to flow into the second flow path are provided as the flow inlet;

the first flow inlet and the second flow inlet are open upwardly;

the article storage facility further comprises a closing body that closes the first flow inlet in a state in which ventilation is possible as viewed in the up-down direction;

the second guide body includes a first wall portion and a second wall portion installed in a forward direction relative to the first wall portion, the second wall portion includes a longitudinal wall portion extending in the up-down direction and a width direction, and a lateral wall portion extending rearwardly from a lower end of the longitudinal wall portion, and the closing body and the second wall portion are installed such that an upper end of the second wall portion and a rear end of the closing body are at the same height.

2. The article storage facility according to claim 1, wherein the guide portion includes a second flow outlet for allowing a gas inside the second flow path to flow out into the flow path space, and an opening area of the second flow inlet is larger than an opening area of the second flow outlet.

3. The article storage facility according to claim 1, wherein:

the flow path space includes a main flow path space extending in the up-down direction, and a sub-flow path space that is located forward relative to the main flow path space and is in communication with the main flow path space in the front-rear direction, the article storage facility comprises, between the main flow path space and the sub-flow path space, a front-rear partition body that is installed in an orientation extending in a width direction intersecting the front-rear direction as viewed in the up-down direction so as to partly partition the main flow path space and the sub-flow path space in the front-rear direction, and is provided at a portion in the up-down direction, the up-down partition body that partitions the uppermost storage section of the plurality of storage sections and a storage section adjacent to a lower portion of the uppermost storage section is used as an uppermost up-down partition body, and the front-rear partition body is installed at the same height as the uppermost up-down partition body or at a higher height than the uppermost up-down partition body.

4. The article storage facility according to claim 3, wherein:

a frame body is provided between the main flow path space and the sub-flow path space, the frame body is formed by a grid-like combination of a plurality of longitudinal members in an orientation extending in the up-down direction and a plurality of lateral members in an orientation extending in the width direction, the up-down partition body is supported by the frame body, and the front-rear partition body is constituted by a part of the lateral members of the frame body.

5. The article storage facility according to claim 4, wherein:

the up-down partition body is formed in a plate shape extending in the front-rear direction and the width direction, the up-down partition body is supported in a cantilevered manner by the frame body in a state in which a rear end portion of the up-down partition body is coupled to the frame body, and the up-down partition body includes a support portion that supports, from below, articles stored in the storage sections, and also includes, in a portion located rearward relative to the support portion, a through portion extending therethrough in the up-down direction.

6. The article storage facility according to claim 1, wherein an air rectifying body that closes the flow path space in a state in which ventilation is possible as viewed in the up-down direction is disposed at at least one location of the flow path space in the up-down direction.

7. The article storage facility according to claim 6, wherein:

a plurality of the air rectifying bodies are provided so as to be aligned in the up-down direction in the flow path space, and the plurality of air rectifying bodies have a shape that decreases an opening ratio of the flow path space as an arrangement height thereof moves downward.

8. The article storage facility according to claim 1, further comprising, below the lowermost storage section of the plurality of storage sections and above the gas exhaust portion, a limiting body that covers a lower portion of the flow path space in a state in which gas ventilation is limited, and wherein the limiting body extends forwardly from the wall portion to a position that overlaps the lowermost storage section as viewed in the up-down direction.

9. The article storage facility according to claim 1, wherein:

the flow path space includes: a main flow path space extending in the up-down direction; and a sub-flow path space disposed in a forward direction relative to the main flow path space and in communication with the main flow path in the front-rear direction, and an opening is formed in the lateral wall portion which penetrates in the up-down direction at a position at which the lateral wall portion overlaps the sub-flow path space.

10. The article storage facility according to claim 1, wherein: the guide portion includes a guide rail for guiding the transport device in a width direction, And the width direction being orthogonal to both the up-down direction and front-rear direction.

* * * * *

UNITED STATES PATENT AND TRADEMARK OFFICE
CERTIFICATE OF CORRECTION

PATENT NO. : 10,804,128 B2  
APPLICATION NO. : 15/697705  
DATED : October 13, 2020  
INVENTOR(S) : Takeshi Abe et al.

Page 1 of 1

It is certified that error appears in the above-identified patent and that said Letters Patent is hereby corrected as shown below:

On the Title Page

Column 2, Item (57) Abstract, Line 1, Delete "Si" and insert -- S1 --

Column 2, Item (57) Abstract, Line 17, Delete "Si" and insert -- S1 --

In the Claims

Column 20, Line 60, Claim 10, delete "And" and insert -- and --

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*